US007969052B2

(12) United States Patent
Ichise et al.

(10) Patent No.: US 7,969,052 B2
(45) Date of Patent: Jun. 28, 2011

(54) BUS BAR STRUCTURE AND INVERTER-INTEGRATED ELECTRIC COMPRESSOR

(75) Inventors: Yuki Ichise, Aichi (JP); Takayuki Hagita, Aichi (JP); Takayuki Watanabe, Aichi (JP); Hiroyuki Kamitani, Aichi (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 276 days.

(21) Appl. No.: 12/442,580

(22) PCT Filed: Nov. 7, 2008

(86) PCT No.: PCT/JP2008/070290
§ 371 (c)(1),
(2), (4) Date: Mar. 24, 2009

(87) PCT Pub. No.: WO2009/066569
PCT Pub. Date: May 28, 2009

(65) Prior Publication Data
US 2010/0181850 A1 Jul. 22, 2010

(30) Foreign Application Priority Data
Nov. 20, 2007 (JP) .................................. 2007-300546

(51) Int. Cl.
*H02K 11/00* (2006.01)

(52) U.S. Cl. ........................................ 310/71; 310/68 D
(58) Field of Classification Search .................... 310/71, 310/68 R, 68 D
See application file for complete search history.

(56) References Cited

U.S. PATENT DOCUMENTS
5,412,269 A * 5/1995 Couture ...................... 310/67 R
(Continued)

FOREIGN PATENT DOCUMENTS
| JP | 55-33711 A | 3/1980 |
| JP | 11-203944 A | 7/1999 |
| JP | 2001-60415 A | 3/2001 |
| JP | 2002-281643 A | 9/2002 |

(Continued)

OTHER PUBLICATIONS
International Search Report of PCT/JP2008/070290, dated of mailing Feb. 3, 2009.

*Primary Examiner* — Thanh Lam
(74) *Attorney, Agent, or Firm* — Westerman, Hattori, Daniels & Adrian, LLP

(57) ABSTRACT

A bus bar structure and an inverter-integrated electric compressor that absorb an impact while ensuring vibration resistance are provided. A bus bar structure used for an inverter-integrated electric compressor having a compressor; an electric motor for driving the compressor; an inverter device for converting DC power from a high-voltage power supply to AC power and supplying it to the motor; and a housing for accommodating the compressor, the electric motor, and the inverter device, the inverter device being formed of a circuit board and an electrical component, and an insulating resin for connecting and wiring the circuit board and the electrical component being applied. The bus bar structure is formed of a main body, which is integrally formed of the insulating resin, and an external connecting portion exposed from the insulating resin, the external connecting portion has a bent extending portion that is bent and extends with respect to the main body, and an elastic portion for absorbing vibration of the bus bar structure is formed in part of the bent extending portion.

6 Claims, 4 Drawing Sheets

U.S. PATENT DOCUMENTS

| | | | |
|---|---|---|---|
| 6,291,914 B1 * | 9/2001 | Mukaiyama | 310/68 B |
| 6,472,785 B2 * | 10/2002 | Petit et al. | 310/71 |
| 7,068,507 B2 * | 6/2006 | Pfeifer et al. | 361/699 |
| 7,411,324 B2 * | 8/2008 | Kusumi | 310/68 D |
| 7,781,925 B2 * | 8/2010 | Lacaze | 310/71 |
| 2003/0002998 A1 | 1/2003 | Makino et al. | |
| 2006/0138883 A1 * | 6/2006 | Yagai et al. | 310/71 |

FOREIGN PATENT DOCUMENTS

| | | |
|---|---|---|
| JP | 2002-364536 A | 12/2002 |
| JP | 2003-112586 A | 4/2003 |
| JP | 2004-80873 A | 3/2004 |
| JP | 3760887 B2 | 3/2006 |
| JP | 2006-261100 A | 9/2006 |
| JP | 3827158 B2 | 9/2006 |

* cited by examiner

BUS BAR STRUCTURE AND INVERTER-INTEGRATED ELECTRIC COMPRESSOR

TECHNICAL FIELD

The present invention relates to a bus bar structure and an inverter-integrated electric compressor that are particularly suitable for use in a vehicle air-conditioning apparatus.

BACKGROUND ART

Recently, electric compressors in which electric motors are used as power sources have been adopted as compressors used for vehicle air conditioners. As such an electric compressor, an inverter-integrated electric compressor in which an inverter accommodating portion is provided in a housing, and an inverter device that converts DC power from a high-voltage power supply into three-phase AC power and supplies it to the electric motor is accommodated in this inverter accommodating portion has been put to practical use. As disclosed, for example, in Patent Documents 1 and 2, this inverter device has a printed circuit board provided with a power switching device, a smoothing capacitor, and a control circuit that constitute an inverter circuit and also has a connector for connecting to an external DC power supply or a motor unit. Each of these components is wired and connected using a bus bar integrated plate. This bus bar integrated plate is used as a bus bar assembly in which a plurality of bus bars are integrated with resin insert-molding and secured on an outer peripheral surface of the housing wall while maintaining insulation (see Patent Documents 1 and 2).

In addition, as disclosed in Patent Document 3, a bus bar structure is generally constructed such that a plurality of bus bars formed of an electrically conductive metal and an insulating base made of synthetic resin are laminated. A connecting piece projects from this bus bar laminated body in the horizontal direction of the bus bar laminated body to be wired and connected by welding with each bus bar or various electrical components. On the other hand, as disclosed in Patent Document 4, there are also bus bars having a cross-linked shape that are not provided with an insulating base.

Patent Document 1: the Publication of Japanese Patent No. 3827158
Patent Document 2: the Publication of Japanese Patent No. 3760887
Patent Document 3: Japanese Unexamined Patent Application, Publication No. 2002-281643
Patent Document 4: Japanese Unexamined Patent Application, Publication No. 2004-80873

DISCLOSURE OF INVENTION

Bus bars used for an inverter-integrated electric compressor of a vehicle air conditioner receive jolts in a vehicle during running or vibrations of an engine itself. In contrast, as disclosed in each of the above-described Patent Documents, bus bars are configured so as to be integrated on an outer peripheral wall of a housing to ensure vibration resistance to prevent fatigue and breakage of the bus bars. Furthermore, they are configured such that it is possible to prevent an electrical short circuit as a result of wiring positions of the bus bars being shifted due to the impact of a vehicle collision.

However, because the arrangement of various electrical components in inverter devices is not always the same, there may be cases where the bus bars cannot be integrated with the outer peripheral surface of the housing. In such a case, the bus bars disclosed in Patent Document 3, having a connecting piece projecting from a portion integrated with an insulating resin, or the bus bars disclosed in Patent Document 4 are commonly used as bus bars. Such a bus bar structure is directly influenced by vibrations in the vehicle or the engine itself, resulting in fatigue and breakage of the bus bar and malfunction of the inverter device; therefore, the inverter-integrated electric compressor may break down. In addition, when a vehicle collision occurs, an accommodating portion of the inverter device may be damaged, and a short circuit may occur in the electrical components. Once a short circuit occurs, a large current flows into the electrical components, generating heat, which may induce a secondary accident such as a vehicle fire. In this case, a fire can be prevented by immediately tripping a fuse to cut the electrical connection. However, the fuse may not be correctly tripped, and when a fuse is not installed, another measure for cutting the electrical connection is required.

In addition, the plate thickness of the bus bar may be increased; however, the overall plate thickness of the bus bar becomes large, thus resulting in the overall size of the bus bar becoming large, which is undesirable from the viewpoint of installation space.

The present invention has been conceived in light of the circumstances described above, and an object thereof is to provide a bus bar structure and an inverter-integrated electric compressor having a structure that can endure vibration and absorb an impact while ensuring vibration resistance when receiving an impact without increasing the plate thickness of the bus bar.

In order to solve the above problems, a bus bar structure of the present invention employs the following solutions.

Specifically, a bus bar structure according to the present invention is used for an inverter-integrated electric compressor having a compressor; an electric motor for driving the compressor; an inverter device for converting DC power from a high-voltage power supply to AC power and supplying the AC power to the motor; and a housing for accommodating the compressor, the electric motor, and the inverter device, the inverter device being formed of a circuit board and an electrical component, and an insulating resin for connecting and wiring the circuit board and the electrical component being applied, wherein the bus bar structure is formed of a main body, which is integrally formed of the insulating resin, and an external connecting portion exposed from the insulating resin, the external connecting portion has a bent extending portion that is bent and extends with respect to the main body, and an elastic portion for absorbing vibration of the bus bar structure is formed in part of the bent extending portion.

According to the present invention, in particular, when being used for an inverter-integrated electric compressor of a vehicle air-conditioning apparatus, even when being affected by jolts in the vehicle during running or vibrations of the engine itself, because it is formed of the main body, which is integrally formed of the insulating resin, and the external connecting portion exposed from the insulating resin, because this external connecting portion has the bent extending portion that is bent and extends with respect to the main body, and because the elastic portion for absorbing vibrations of the bus bar is formed in part of the bent extending portion, the jolts in the vehicle or the vibrations of the engine itself are absorbed by this elastic portion. Accordingly, it is possible to prevent fatigue and breakage of the bus bar.

With the bus bar structure of the present invention, at the above-described bent extending portion, a breakage starting portion for starting breakage of the bent extending portion when an impact is applied to the bus bar structure may be formed in part of the bent extending portion.

With this configuration, even when an impact is applied to an accommodating portion of the inverter device due to a vehicle collision, because the breakage starting portion where breakage of the bent extending portion starts by concentrating the impact load on the bent extending portion is formed, it is possible to start breakage of the bent extending portion from this breakage starting portion. Accordingly, by cutting conduction of electrical current as a result of breakage of the bus bar, it is possible to prevent a short circuit of the electrical components of the inverter device when a vehicle collision occurs.

With the bus bar structure of the present invention, the above-described elastic portion may be formed by protruding in an arc shape in a width direction of the bent extending portion.

With this configuration, because the above-described elastic portion is formed so as to protrude in an arc shape in the width direction of the bent extending portion, vertical jolts or horizontal jolts as a result of jolts in the vehicle during driving or vibrations of the engine itself can be absorbed by this arc shaped protruding elastic portion. Accordingly, fatigue and breakage due to vibrations of the bus bar can be prevented. In addition, processing is easy due to a simple structure achieved merely by making part of the bent extending portion protrude in an arc shape.

With the bus bar structure of the present invention, the above-described breakage starting portion may be formed so that part of the width in the width direction of the bent extending portion is reduced toward the center in the width direction of the bent extending portion.

With this configuration, even when an impact is applied to the accommodating portion of the inverter device due to, for example, a vehicle collision, because the above-described breakage starting portion is formed by reducing part of the width of the bent extending portion toward the center in the width direction of the bent extending portion, it is possible to start breakage of the bent extending portion from this breakage starting portion by concentrating the impact load on the portion whose width is reduced. Accordingly, by cutting conduction of electrical current as a result of breakage of the bus bar, it is possible to prevent a short circuit of the electrical components of the inverter device when a vehicle collision occurs. In addition, processing is easy due to a simple structure achieved merely by making part of the bent extending portion protrude in an arc shape.

With the bus bar structure of the present invention, the above-described breakage starting portion may be formed of V-shaped notches at symmetrical positions with respect to both ends of the bent extending portion toward the center in the width direction of the bent extending portion.

According to the present invention, because the above-described breakage starting portion is formed of the V-shaped notches at symmetrical positions with respect to both ends of the bent extending portion toward the center in the width direction of the bent extending portion, processing is easy due to a simple structure. Furthermore, by aligning the orientations of the V-shaped notches according to the placement orientation of the electric compressor with respect to the vehicle travelling direction, when the bus bar receives an impact, the impact load is concentrated on the V-shaped notches; therefore, the bent extending portion can be made to break more reliably. Accordingly, by reliably breaking the bus bar to cut conduction of electrical current, it is possible to further prevent a short circuit of the electrical components when the inverter device is damaged due to a vehicle collision.

An inverter-integrated electric compressor of the present invention comprises a compressor; an electric motor for driving the compressor; an inverter device for converting DC power from a high-voltage power supply to AC power and supplying the AC power to the electric motor; and a housing for accommodating the compressor, the electric motor, and the inverter device, wherein the inverter device is formed of a circuit board and an electrical component, and a bus bar structure for connecting and wiring the circuit board and the electrical component is any one of the above-described bus bar structures.

According to the inverter-integrated electric compressor of the present invention, with the inverter-integrated electric compressor that is particularly suitable for use in a vehicle air-conditioning apparatus and that includes the above-described bus bar structure, even when being affected by jolts in the vehicle during running or vibrations of the engine itself, the reliability of the inverter-integrated electric compressor is improved by preventing failure of the inverter-integrated electric compressor as a result of damage to the bus bar. Furthermore, even when the inverter device is damaged due to a vehicle collision, damage to the inverter-integrated electric compressor can be reduced.

According to the bus bar structure of the present invention, even when being affected by jolts in the vehicle during running or vibrations of the engine itself, it is possible to effectively absorb these jolts or vibrations with a simple structure. Accordingly, damage to the bus bar due to, for example, fatigue and breakage can be prevented, thus preventing a problem such as failure of the inverter device. Furthermore, even when the accommodating portion of the inverter device is damaged due to a vehicle collision, it is possible to reliably break the bent extending portion of the bus bar. Accordingly, it is possible to prevent a secondary accident such as a vehicle fire due to a short circuit of the electrical components of the inverter device by reliably breaking the bus bar to cut conduction of electrical current regardless of whether or not a fuse is provided.

In addition, according to the inverter-integrated electric compressor of the present invention, with the inverter-integrated electric compressor that is particularly suitable for use in a vehicle air-conditioning apparatus and that accommodates the bus bar of the present invention, even when being affected by jolts in the vehicle during running or vibrations of the engine itself, failure of the inverter-integrated electric compressor as a result of damage to the bus bar is prevented. Furthermore, even when the inverter device is damaged due to a vehicle collision, damage to the inverter-integrated electric compressor can be reduced. Accordingly, it is possible to improve the reliability of the inverter-integrated electric compressor and to prevent a secondary accident such as a vehicle fire by reducing damage when a vehicle collision occurs.

EXPLANATION OF REFERENCE SIGNS

Figure 1:
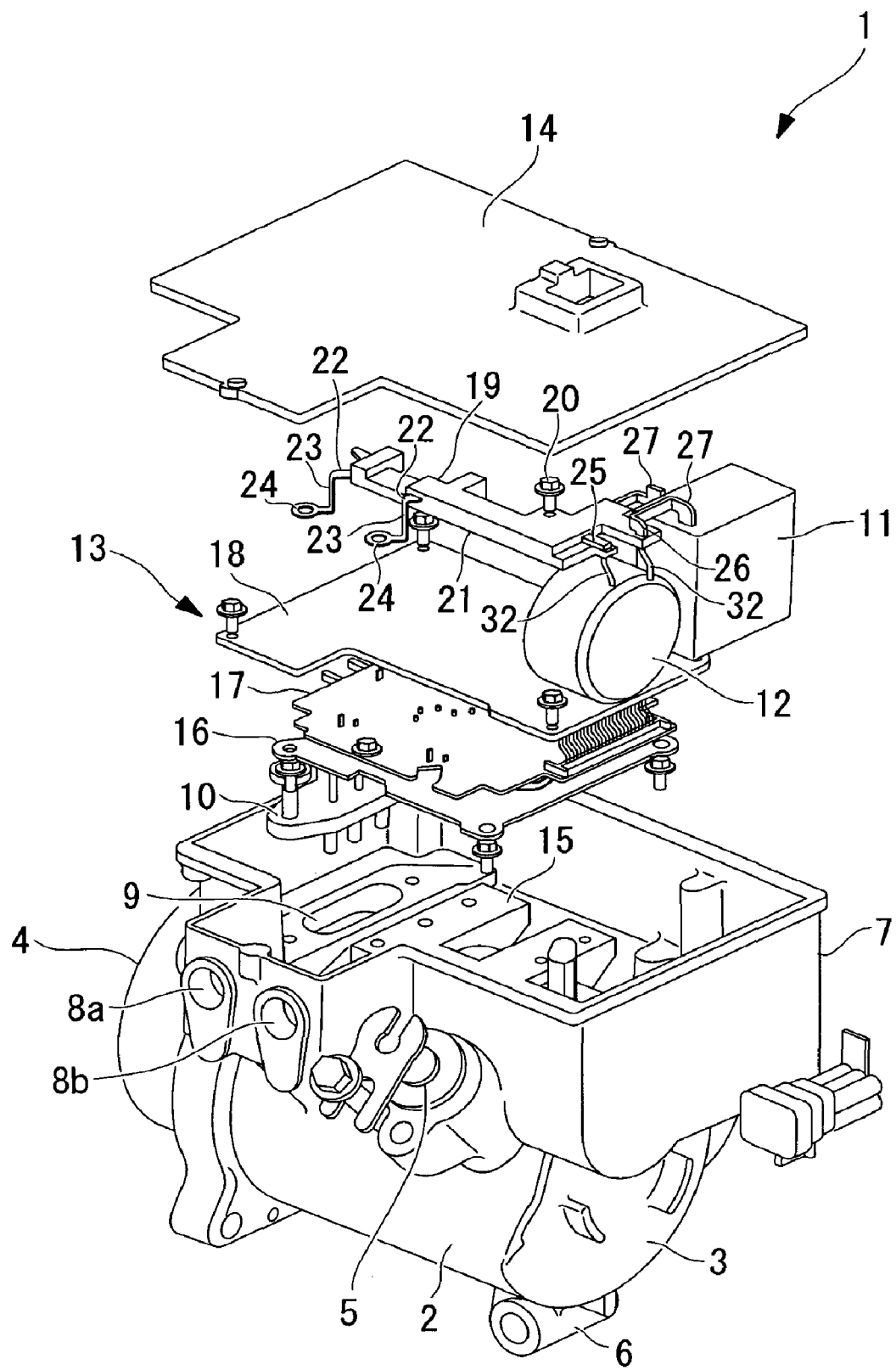
FIG. 1 is an exploded perspective view of an inverter-integrated electric compressor 1 according to an embodiment of the present invention.

1: inverter-integrated electric compressor
2: housing
3: motor housing
4: compressor housing
7: inverter accommodating portion
11: head capacitor
12: inductor
13: inverter device
14: lid
19: bus bar assembly
21: bus bar main body
22, 25, 26, and 27: external connecting portion
23: bent extending portion
24: end portion
28: elastic portion
29: breakage starting portion
30: vehicle
31: engine compartment
32: enameled wire

BEST MODE FOR CARRYING OUT THE INVENTION

An embodiment of the present invention will be described below with reference to the drawings.

First Embodiment

A first embodiment of the present invention will be described below with reference to FIGS. 1 to 3.

FIG. 1 shows an exploded perspective view of an inverter-integrated electric compressor 1 according to the first embodiment of the present invention. The inverter-integrated electric compressor 1 has a housing 2 constituting an outer shell thereof. The housing 2 is constructed by integrally securing a motor housing 3 that accommodates an electric motor (not shown), and a compressor housing 4 that accommodates a compressor (not shown). The motor housing 3 and the compressor housing 4 are formed by aluminum die-casting.

The electric motor (not shown) and the compressor (not shown) accommodated respectively in the motor housing 3 and the compressor housing 4 are linked to each other via a motor shaft, and the compressor is driven by the rotation of the electric motor. A rear end of the motor housing 3 is provided with a suction port 5, and low-pressure refrigerant gas taken into the motor housing 3 through this suction port 5 flows around the electric motor and is taken into the compressor so as to be compressed. High-temperature high-pressure refrigerant gas compressed by the compressor is discharged into the compressor housing 4, and is then discharged to the outside through a discharge port (not shown) provided at the front end of the compressor housing 4.

A box-shaped inverter accommodating portion 7 is integrally formed at an upper part of an outer peripheral surface of the motor housing 3. The inverter accommodating portion 7 has a box structure having an open upper surface and surrounded by peripheral walls of a predetermined height (see FIG. 1). Two power cable outlets 8a and 8b are provided on a side surface of this inverter accommodating portion 7. In addition to a motor terminal mounting hole 9 and a metal-plate heat-dissipating surface 15 being provided in the inverter accommodating portion 7, DC power P-N terminals to which power-supply cables (not shown) are connected, metal-plate mounting bosses, CPU-board mounting bosses, and so forth are provided therein. In addition, the inverter accommodating portion 7 accommodates a motor terminal 10 that is mounted in the motor terminal mounting hole 9, a head capacitor 11, an inductor 12, an inverter device 13, and so forth. The top surface thereof is covered with a lid 14 that is secured with screws.

As shown in FIG. 1, the inverter device 13 has an aluminum alloy metal plate 16, functioning as a heat sink, that is fixed on the bosses at four corners such that it is in contact with the heat-dissipating surface 15 of the inverter accommodating portion 7; a power board 17 on which a power-related control circuit for operating a power switching device (hereinafter, referred to as "IGBT"; (Insulated Gate Bipolar Transistor)), not shown, mounted on this metal plate 16 is mounted, and which is disposed on the bosses on the metal plate 16; a CPU board 18 on which a circuit having elements that operate at low voltage, such as a CPU, is mounted and which is secured to the bosses at the four corners thereof; and a bus bar assembly 19 that has a plurality of bus bars functioning as wiring of the inverter device 13 and that is integrally formed by resin insert molding serving as an insulator.

The bus bar assembly 19 is formed as a single component by integrating, with an insert-molding resin, P-N bus bars that connect the IGBTs (not shown) and the DC power P-N terminals and a plurality of bus bars that connect the IGBTs and the motor terminal 10. This bus bar assembly 19 is formed in an L shape so as to face the DC power P-N terminals and the motor terminal 10, and is integrally secured on the inverter accommodating portion 7 with screws 20 along two adjacent sides of the power board 17. (See FIG. 1)

Figure 2:
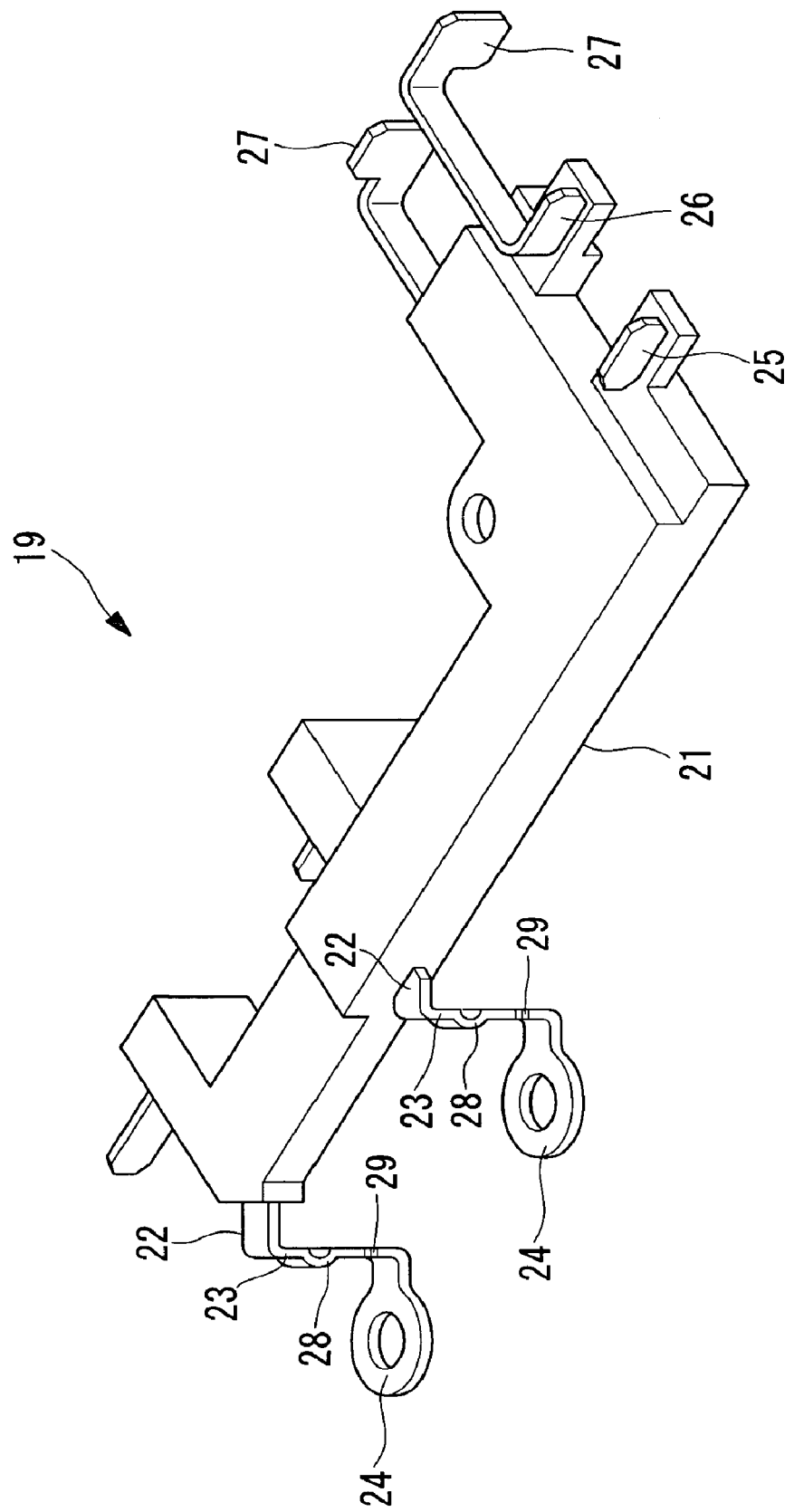
FIG. 2 is a side view of a bus bar assembly according to an embodiment of the present invention.

A perspective view of the bus bar assembly 19 is shown in FIG. 2. This bus bar assembly 19 is formed of a bus bar main body 21 integrally formed of the insulating resin, and external connecting portions 22 that are exposed from the insulating resin and that protrude from the bus bar main body 21. The external connecting portions 22 have bent extending portions 23 that are bent in a direction substantially orthogonal to the bus bar main body 21 and extend below the bus bar main body 21 (power board 17 side in FIG. 1). End portions 24 are further provided from the bent extending portions 23 in such a manner as to be substantially vertically bent and parallel with the bus bar main body 21. The end portions 24 are connected to the P-N terminals (not shown) by bolting them down. As shown in FIG. 1, external connecting portions 25 and 26 are connected to the inductor 12. External connecting portions 27 are connected to the head capacitor 11. In addition, brass is normally used as a material for the external connecting portions 22 formed of an electrically conductive metal exposed from the insulating resin, and nickel plating is performed thereon. Alternatively, the material may be a tin-plated cold-rolled steel sheet.

Figure 3:
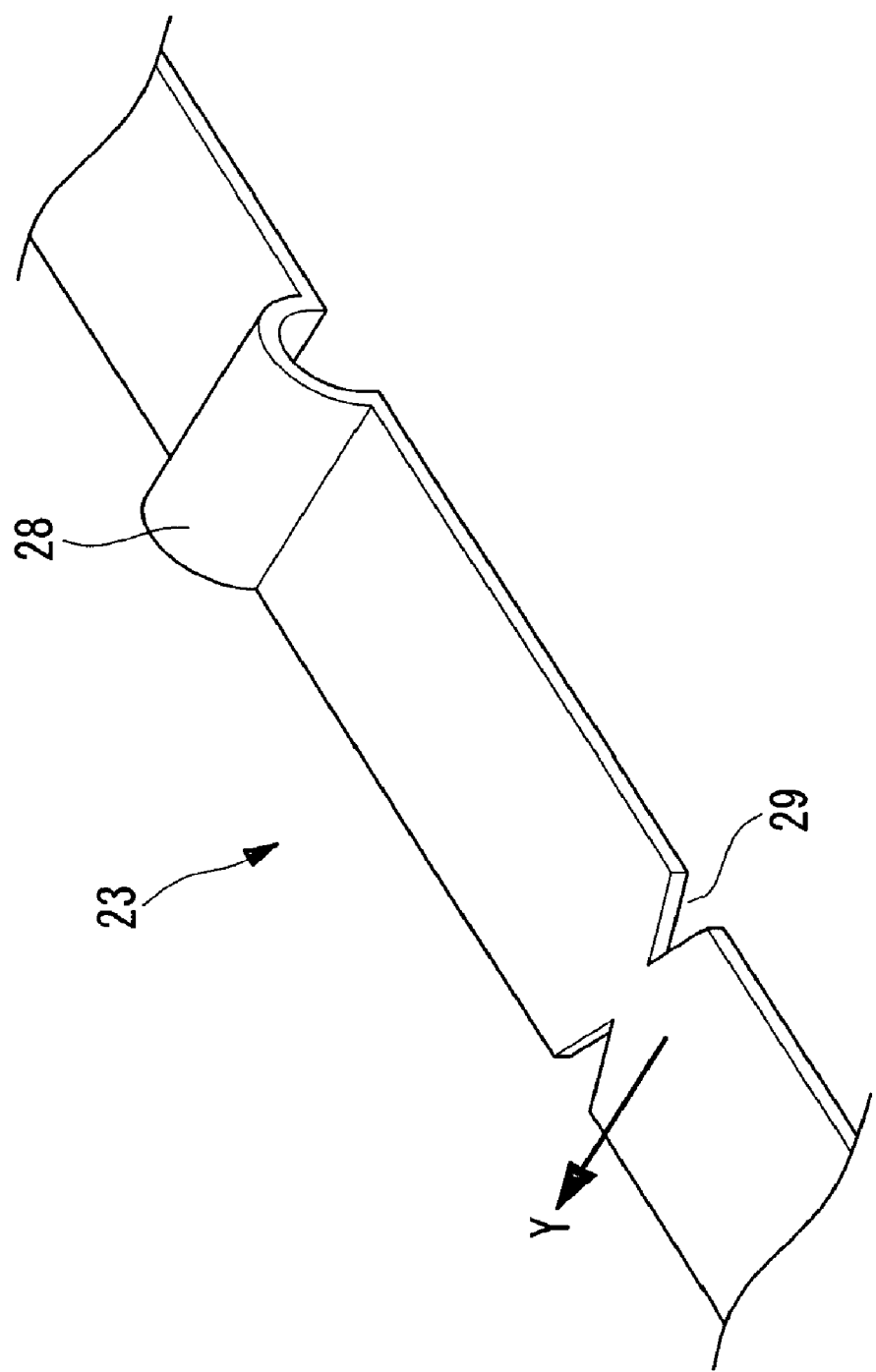
FIG. 3 is a magnified view of a bent extending portion of the bus bar assembly.

FIG. 3 shows a magnified view of the bent extending portion 23 shown in FIG. 2. The right side in FIG. 3 corresponds to the bus bar main body 21. As shown in FIGS. 2 and 3, an elastic portion 28 formed so as to protrude in an arc shape in the width direction of the bent extending portion 23, in plan view, is provided at an intermediate position of the bent extending portion 23 that extends from the external connecting portion 22 while being bent substantially orthogonal to the bus bar main body 21. Furthermore, at an intermediate position thereof, a breakage starting portion 29 is formed by reducing part of the width of the bent extending portion 23 toward the center in the width direction of the bent extending portion 23.

In addition, the breakage starting portion 29 of this embodiment is an example in which V-shaped notches are formed at symmetrical positions with respect to both ends of the bent extending portion 23 toward the center in the width direction of the bent extending portion 23. As shown in this figure, the elastic portion 28 and the breakage starting portion 29 are provided in parallel at an intermediate part of the bent extending portion 23.

In addition, the breakage starting portion 29 of this embodiment is an example in which V-shaped notches are formed at symmetrical positions with respect to both ends of the bent extending portion 23 toward the center in the width direction of the bent extending portion 23. As shown in this figure, the elastic portion 28 and the breakage starting portion 29 are provided in parallel at an intermediate part of the bent extending portion 23.

With the above-described configuration, this embodiment provides the following advantages.

The inverter-integrated electric compressor 1 is also affected by jolts as a result of jolts in a vehicle body that occur when the vehicle is running. In addition, the inverter-integrated electric compressor 1 may vibrate due to vibrations of the engine itself when the engine is running. When the jolts or the vibrations occur at the inverter-integrated electric compressor 1, the inverter device 13 or the inverter accommodating portion 7 are also affected by the jolts or the vibrations. As shown in FIG. 3, because the elastic portion 28 is formed in part of the bent extending portion 23 so as to protrude in an arc shape, in plan view, the jolts or the vibrations are absorbed by the elastic portion 28. As a result, it is possible to prevent fatigue and breakage of the external connecting portions 22, the bent extending portions 23, and the end portions 24 that are exposed from the insulating resin, thus preventing damage to the bus bar assembly 19 and preventing problems such as failure of the inverter device 13.

Furthermore, if the inverter accommodating portion 7 is damaged when a vehicle collision occurs, as shown in FIG. 3, because the breakage starting portion 29 that is formed of the V-shaped notches at symmetrical positions with respect to both ends of the bent extending portion 23 toward the center in the width direction of the bent extending portion 23 is formed, even when an impact is applied to the bus bar assembly 19, the impact load is concentrated on the V-shaped notches to break the bent extending portion 23. As a result, by reliably breaking the bent extending portion 23 at the breakage starting portion 29, conduction of electrical current flowing into the bus bar assembly 19 can be cut regardless of whether or not a fuse is provided. Accordingly, it is possible to prevent a short circuit of electrical components of the inverter device 13, thus preventing a secondary accident such as a vehicle fire.

Second Embodiment

Next, a second embodiment of the present invention will be described using the drawings.

Figure 4A:
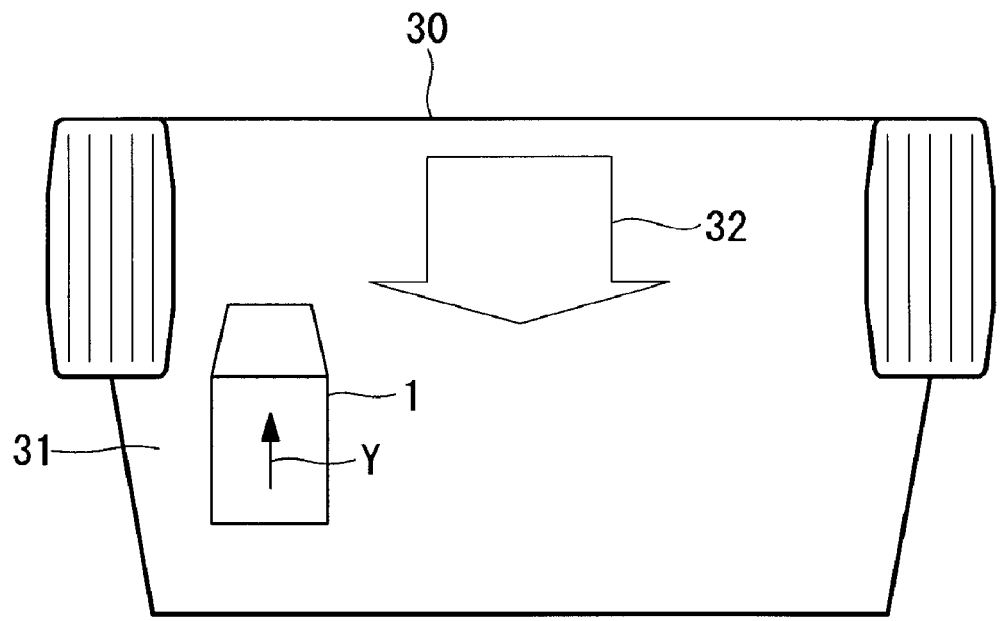
FIG. 4A is a plan view showing the vehicle positional orientation of an inverter-integrated electric compressor according to an embodiment of the present invention.
Figure 4B:
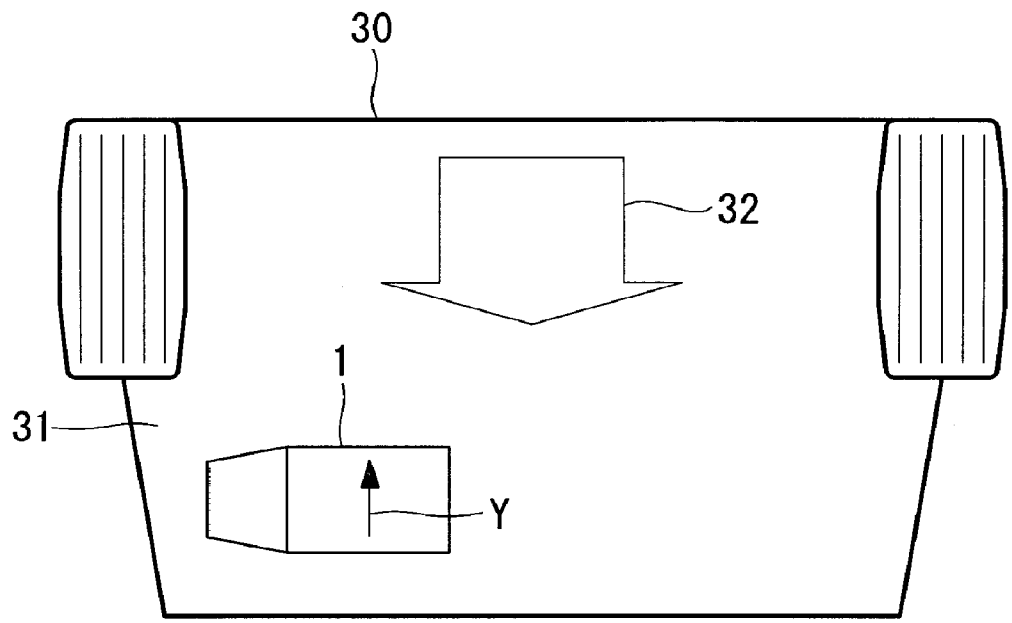
FIG. 4B is a plan view showing the vehicle positional orientation of an inverter-integrated electric compressor according to an embodiment of the present invention.

FIGS. 4A and 4B show a plan view of the inverter-integrated electric compressor 1 using the bus bar structure of the first embodiment when it is mounted on a vehicle.

In this embodiment, for example, the inverter-integrated electric compressor 1 has a mounting leg 6 (see FIG. 1) provided at a lower part of the rear end of the motor housing 3 and mounting legs (not shown) respectively provided at the front end of the compressor housing 4 and an upper part thereof and is mounted by securing it to a bracket provided on a side wall of a vehicle driving engine (not shown) with bolts via these mounting legs provided at three locations.

As shown in FIG. 4A, the inverter-integrated electric compressor 1 using the bus bar structure of the first embodiment described above is disposed closer toward the left side of an engine compartment 31 of a vehicle 30, and is longitudinally disposed horizontally with respect to the vehicle travelling direction indicated by an arrow 32. At this time, in the V-shaped notches corresponding to the breakage starting portion 29 provided in the bent extending portion 23 of the bus bar assembly 19 shown in FIG. 3, the Y-axis directional orientation shown in the figure is arranged so as to be the same as the Y-axis directional orientation shown in FIG. 4A.

On the other hand, in FIG. 4B, the inverter-integrated electric compressor 1 using the bus bar structure of the first embodiment described above is disposed closer toward the left side of the engine compartment 31 of the vehicle 30 and is transversely disposed vertically with respect to the vehicle travelling direction indicated by the arrow 32. Even when the inverter-integrated electric compressor 1 is transversely disposed, the V-shaped notches corresponding to the breakage starting portion 29 provided in the bent extending portion 23 of the bus bar assembly 19 shown in FIG. 3 are arranged in such a manner that the Y-axis directional orientation shown in the figure is the same as the Y-axis directional orientation shown in FIG. 4A.

With the above-described configuration, this embodiment provides the following advantages.

When the vehicle 30 receives a front impact caused by an accident, the driving engine (not shown) or the inverter-integrated electric compressor 1 in the engine compartment 31 shown in FIGS. 4A and 4B may be damaged as a result of receiving that impact.

In this embodiment, the directional orientation of the notches corresponding to the breakage starting portion 29 provided in part of the bent extending portion 23 of the bus bar assembly 19 shown in FIG. 3 is arranged, in the inverter device 13, in such a manner that the Y-axis directions that are in the horizontal direction with respect to the arrows 32 indicating the vehicle travelling direction shown in FIGS. 3, 4A, and 4B are respectively the same direction. Accordingly, even when the inverter accommodating portion 7 is damaged due to a vehicle collision, because the notches corresponding to the breakage starting portion 29 are disposed in the same direction as the vehicle travelling direction, breakage starts from the notches, thus expediting breakage at the bent extending portion 23. Therefore, by reliably breaking the bent extending portion 23 from the breakage starting portion 29, conduction of electrical current flowing into the bus bar assembly 19 can be cut. Accordingly, it is possible to prevent a short circuit of various electrical components and to reduce damage to the inverter-integrated electric compressor, thus preventing a secondary accident such as a vehicle fire.

The invention claimed is:

1. A bus bar structure that is used for an inverter-integrated electric compressor having:
    a compressor;
    an electric motor for driving the compressor;
    an inverter device for converting DC power from a high-voltage power supply to AC power and supplying the AC power to the electric motor; and
    a housing for accommodating the compressor, the electric motor, and the inverter device, the inverter device being formed of a circuit board and an electrical component, and an insulating resin for connecting and wiring the circuit board and the electrical component being applied, wherein the bus bar structure is formed of a main body, which is integrally formed of the insulating resin, and an external connecting portion exposed from the insulating resin, the external connecting portion has a bent extending portion that is bent and extends with respect to the main body, and an elastic portion for absorbing vibration of the bus bar structure is formed in part of the bent extending portion.

2. A bus bar structure according to claim 1, wherein at the bent extending portion, a breakage starting portion for starting breakage of the bent extending portion when an impact is applied to the bus bar structure is formed in part of the bent extending portion.

3. A bus bar structure according to claim 1, wherein the elastic portion is formed by protruding in an arc shape in a width direction of the bent extending portion.

4. A bus bar structure according to claim 2, wherein the breakage starting portion is formed so that part of the width in the width direction of the bent extending portion is reduced toward the center in the width direction of the bent extending portion.

5. A bus bar structure according to claim 4, wherein the breakage starting portion is formed of V-shaped notches at symmetrical positions with respect to both ends of the bent extending portion toward the center in the width direction of the bent extending portion.

6. An inverter-integrated electric compressor comprising:
a compressor;
an electric motor for driving the compressor;
an inverter device for converting DC power from a high-voltage power supply to AC power and supplying the AC power to the electric motor; and
a housing for accommodating the compressor, the electric motor, and the inverter device,
wherein the inverter device is formed of a circuit board and an electrical component, and a bus bar structure for connecting and wiring the circuit board and the electrical component is a bus bar structure according to claim 1.

* * * * *